United States Patent
Sakai (10) Patent No.: US 11,348,902 B2
(45) Date of Patent: May 31, 2022

(54) SEMICONDUCTOR MODULE, POWER CONVERSION DEVICE, AND MOVABLE BODY

(71) Applicant: Mitsubishi Electric Corporation, Tokyo (JP)

(72) Inventor: Junya Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 242 days.

(21) Appl. No.: 16/755,875

(22) PCT Filed: Nov. 21, 2017

(86) PCT No.: PCT/JP2017/041796
§ 371 (c)(1),
(2) Date: Apr. 13, 2020

(87) PCT Pub. No.: WO2019/102519
PCT Pub. Date: May 31, 2019

(65) Prior Publication Data
US 2021/0159218 A1 May 27, 2021

(51) Int. Cl.
*H01L 25/07* (2006.01)
*H01L 23/498* (2006.01)
(Continued)

(52) U.S. Cl.
CPC ...... *H01L 25/072* (2013.01); *H01L 23/49844* (2013.01); *H01L 29/1608* (2013.01);
(Continued)

(58) Field of Classification Search
CPC .......... H02M 1/00; H02M 1/096; H02M 1/10; H02M 1/42; H02M 1/4233; H02M 3/00;
(Continued)

(56) References Cited

U.S. PATENT DOCUMENTS

| | | | | |
|---|---|---|---|---|
| 3,530,360 A | * | 9/1970 | Relation | ................ H02H 7/122 363/135 |
| 7,777,433 B2 | * | 8/2010 | Yamaguchi | ........... H02M 7/003 318/139 |
| 8,816,625 B2 | * | 8/2014 | Kopiness | ............ H02M 5/4585 318/430 |

FOREIGN PATENT DOCUMENTS

JP   H07-007958 A   1/1995

OTHER PUBLICATIONS

International Search Report issued in PCT/JP2017/041796; dated Feb. 6, 2018.

* cited by examiner

*Primary Examiner* — Antony M Paul
(74) *Attorney, Agent, or Firm* — Studebaker & Brackett PC (57) ABSTRACT

A semiconductor module includes: a first terminal portion and a second terminal portion each connected to outside; and a first current path and a second current path to connect between the first terminal portion and the second terminal portion in parallel. The first current path includes: a first semiconductor device; a first wiring portion and a second wiring portion. The second current path includes: a second semiconductor device; a third wiring portion; and a fourth wiring portion. A power conducting capability of the first semiconductor device is lower than a power conducting capability of the second semiconductor device, and a total of an impedance of the first wiring portion and an impedance of the second wiring portion is lower than a total of an impedance of the third wiring portion and an impedance of the fourth wiring portion.

20 Claims, 5 Drawing Sheets

(51) Int. Cl.
*H01L 29/16* (2006.01)
*H01L 29/739* (2006.01)
*H02M 7/00* (2006.01)
*H02M 7/5387* (2007.01)
*H02P 27/08* (2006.01)

(52) U.S. Cl.
CPC ........ *H01L 29/7393* (2013.01); *H02M 7/003* (2013.01); *H02M 7/53871* (2013.01); *H02P 27/08* (2013.01)

(58) Field of Classification Search
CPC ........ H02M 3/04; H02M 3/06; H02M 3/1584; H02M 3/1588; H02M 3/16; H02M 3/20; H02M 3/24; H02M 3/285; H02M 3/3372; H02M 3/34; H02M 5/00; H02M 5/257; H02M 5/40; H02M 5/45; H02M 5/458; H02M 7/02; H02M 7/04; H02M 7/162; H02M 7/217; H02M 7/219; H02M 7/42; H02M 7/521; H02M 7/538466; H02M 7/68; H02M 7/797; H02M 7/86; H02M 2001/0032; H02M 2005/00; H02M 2005/293; H02P 1/00; H02P 1/16; H02P 1/24; H02P 1/42; H02P 1/46; H02P 3/00; H02P 6/00; H02P 6/26; H02P 7/28; H02P 7/292; H02P 7/295; H02P 27/00; H02P 27/04; H02P 27/06; H02P 27/08
See application file for complete search history.

SEMICONDUCTOR MODULE, POWER CONVERSION DEVICE, AND MOVABLE BODY

TECHNICAL FIELD

The present invention relates to a semiconductor module, a power conversion device, and a movable body, particularly, a semiconductor module including semiconductor devices connected to one another in parallel, a power conversion device including the semiconductor module, and a movable body including the power conversion device.

BACKGROUND ART

An electrically driven movable body includes a power conversion device to convert received power and output the converted power. Such a power conversion device includes a main conversion circuit having semiconductor devices. In recent years, in order to provide a movable body that can handle a large amount of power, it has been required to increase a current capacity of the main conversion circuit. One method for increasing the current capacity of the main conversion circuit is to connect a plurality of semiconductor devices in parallel between two terminals connected to a DC power supply in the main conversion circuit.

Such a main conversion circuit cannot be operated normally when the life of any one of the plurality of semiconductor devices connected to one another in parallel is expired. That is, the life of the main conversion circuit coincides with the semiconductor device having the shortest life among the plurality of semiconductor devices.

Japanese Patent Laying-Open No. 7-7958 (Patent Literature 1) discloses a power conversion device including: a plurality of semiconductor devices connected to one another in parallel; and a parallel connection portion to connect between each semiconductor device and a DC power supply. The parallel connection portion is provided to connect between the respective semiconductor devices and the DC power supply with wirings having the same length so as to attain an uniform impedance in current paths between the respective semiconductor devices and the DC power supply.

CITATION LIST

Patent Literature

PTL 1: Japanese Patent Laying-Open No. 7-7958

SUMMARY OF INVENTION

Technical Problem

However, in the power conversion device described in Patent Literature 1, a variation in characteristics (power conduction capabilities) among the mounted semiconductor devices is not taken into consideration.

Generally, the power conduction capabilities of the plurality of semiconductor devices of the same specification are varied. In the semiconductor module described in Patent Literature 1, the plurality of semiconductor devices of the same specification are connected to the DC power supply with the wirings having the same length by the parallel connection portion. Hence, the variation in the power conducting capabilities of the semiconductor devices leads to a variation in values of currents flowing in the semiconductor devices. As a result, in the semiconductor module of Patent Literature 1, due to a variation in loads imposed on the semiconductor devices, the lives of the semiconductor devices are also varied. As a result, the life of the semiconductor module of Patent Literature 1 is less likely to be sufficiently extended, with the result that reliability cannot be sufficiently improved.

A main object of the present invention is to provide a semiconductor module that includes a plurality of semiconductor devices connected to one another in parallel and that has reliability improved as compared with the above-described conventional semiconductor module.

Solution to Problem

A semiconductor module according to the present invention includes: a first terminal portion and a second terminal portion each connected to outside; and a first current path and a second current path to connect between the first terminal portion and the second terminal portion in parallel. The first current path includes: a first semiconductor device; a first wiring portion to connect between the first terminal portion and the first semiconductor device; and a second wiring portion to connect between the first semiconductor device and the second terminal portion. The second current path includes: a second semiconductor device; a third wiring portion to connect between the first terminal portion and the second semiconductor device; and a fourth wiring portion to connect between the second semiconductor device and the second terminal portion. A power conducting capability of the first semiconductor device is lower than a power conducting capability of the second semiconductor device, and a total of an impedance of the first wiring portion and an impedance of the second wiring portion is lower than a total of an impedance of the third wiring portion and an impedance of the fourth wiring portion.

Advantageous Effects of Invention

In the semiconductor module according to the present invention, the total of the impedances of the first wiring portion and the second wiring portion connected to the first semiconductor device having a relatively low power conducting capability is lower than the total of the impedances of the third wiring portion and the fourth wiring portion connected to the second semiconductor device having a relatively high power conducting capability. Accordingly, in the semiconductor module according to the present invention, a variation in the impedances between the first current path and the second current path is suppressed to be less than a variation in the power conducting capabilities between the first semiconductor device and the second semiconductor device. As a result, according to the present invention, it is possible to provide a semiconductor module having reliability improved as compared with the above-described conventional semiconductor module.

DESCRIPTION OF EMBODIMENTS

The following describes embodiments of the present invention with reference to figures. It should be noted that in the below-described figures, the same or corresponding portions are given the same reference characters and are not described repeatedly.

First Embodiment

Figure 1:
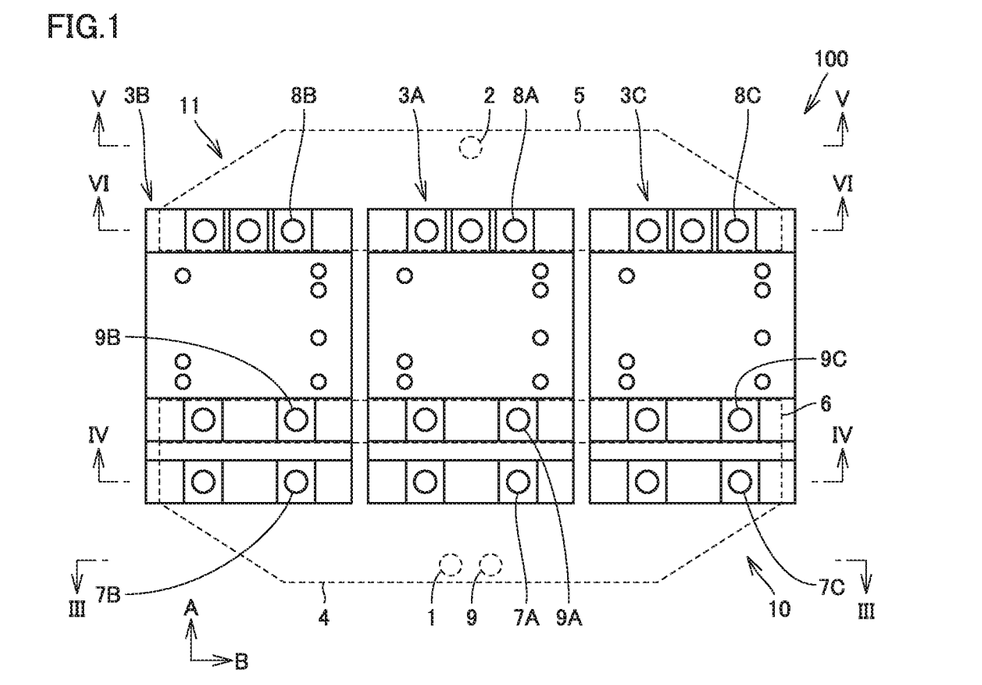
FIG. 1 is a plan view showing a semiconductor module according to a first embodiment.
Figure 7:
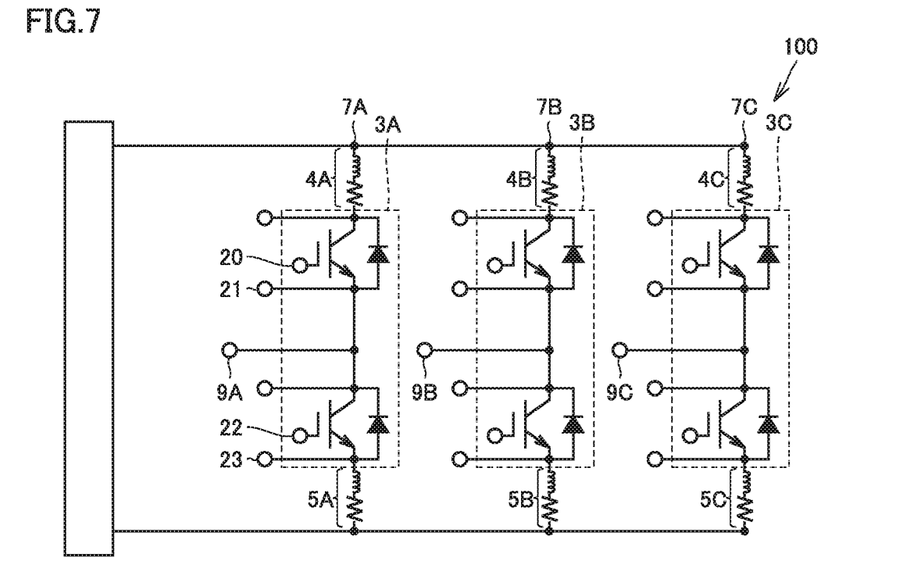
FIG. 7 is a circuit diagram of the semiconductor module according to the first embodiment.

As shown in FIG. 1 and FIG. 7, a semiconductor module 100 according to a first embodiment includes: a first terminal portion 1 and a second terminal portion 2 each connected to outside; and a first current path CP1, a second current path CP2, and a third current path CP3 to connect between first terminal portion 1 and second terminal portion 2 in parallel. First terminal portion 1 is connected to a positive electrode side of a DC power supply disposed outside semiconductor module 100. Second terminal portion 2 is connected to a negative electrode side of the DC power supply. First terminal portion 1 is provided on a first wiring 10 described later. Second terminal portion 2 is provided on a second wiring 11 described later.

As shown in FIG. 7, first current path CP1 includes: a first semiconductor device 3A; a first wiring portion 4A to connect between first terminal portion 1 and first semiconductor device 3A; and a second wiring portion 5A to connect between first semiconductor device 3A and second terminal portion 2.

As shown in FIG. 7, second current path CP2 includes: a second semiconductor device 3B; a third wiring portion 4B to connect between first terminal portion 1 and second semiconductor device 3B; and a fourth wiring portion 5B to connect between second semiconductor device 3B and second terminal portion 2.

As shown in FIG. 7, third current path CP3 includes: a third semiconductor device 3C; a fifth wiring portion 4C to connect between first terminal portion 1 and third semiconductor device 3C; and a sixth wiring portion 5C to connect between third semiconductor device 3C and second terminal portion 2.

First semiconductor device 3A, second semiconductor device 3B, and third semiconductor device 3C are designed and manufactured in accordance with the same specification. As shown in FIG. 7, for example, each of first semiconductor device 3A, second semiconductor device 3B, and third semiconductor device 3C includes: a first semiconductor element and a second semiconductor element connected to each other in series; a third semiconductor element connected to the first semiconductor element in parallel; and a fourth semiconductor element connected to the second semiconductor element in parallel. The first semiconductor element and the second semiconductor element have equivalent characteristics, for example. The third semiconductor element and the fourth semiconductor element have equivalent characteristics, for example. Each of the first semiconductor element and the second semiconductor element may be any switching element, such as a bipolar transistor or an insulated gate type bipolar transistor (IGBT). Each of the third semiconductor element and the fourth semiconductor element is a reflux diode, for example. A material of each of first semiconductor device 3A, second semiconductor device 3B, and third semiconductor device 3C includes a wide band gap semiconductor material such as silicon carbide (SiC), gallium nitride (GaN), or diamond (C). For example, the material includes SiC.

As shown in FIG. 7, in each of first semiconductor device 3A, second semiconductor device 3B, and third semiconductor device 3C, the emitter terminal of the first semiconductor element is connected to the collector terminal of the second semiconductor element. Each of output terminals of first semiconductor device 3A, second semiconductor device 3B, and third semiconductor device 3C is connected between the emitter terminal of a corresponding first semiconductor element and the collector terminal of a corresponding second semiconductor element. The anodes of the third semiconductor element and the fourth semiconductor element are connected to the respective emitter terminals of the first semiconductor element and the second semiconductor element. The cathodes of the third semiconductor element and the fourth semiconductor element are connected to the respective collector terminals of the first semiconductor element and the second semiconductor element.

As shown in FIG. 1, in a plan view, respective collector terminals 7A, 7B, 7C of the first semiconductor elements of first semiconductor device 3A, second semiconductor device 3B, and third semiconductor device 3C are disposed with spaces from emitter terminals 8A, 8B, 8C of the second semiconductor elements. In the plan view, each of output terminals 9A, 9B, 9C of first semiconductor device 3A, second semiconductor device 3B, and third semiconductor device 3C is disposed between a corresponding one of collector terminals 7A, 7B, 7C of the first semiconductor elements and a corresponding one of emitter terminal 8A, 8B, 8C of the second semiconductor elements. Output terminals 9A, 9B, 9C are disposed close to collector terminals 7A, 7B, 7C of the first semiconductor elements relative to emitter terminals 8A, 8B, 8C of the second semiconductor elements, for example.

As shown in FIG. 1 and FIG. 7, collector terminal 7A of the first semiconductor element of first semiconductor device 3A is connected to first terminal portion 1 via first wiring portion 4A. Collector terminal 7B of the first semiconductor element of second semiconductor device 3B is connected to first terminal portion 1 via third wiring portion 4B. Collector terminal 7C of the first semiconductor element of third semiconductor device 3C is connected to first terminal portion 1 via fifth wiring portion 4C.

As shown in FIG. 1 and FIG. 7, emitter terminal 8A of the second semiconductor element of first semiconductor device 3A is connected to second terminal portion 2 via second wiring portion 5A. Emitter terminal 8B of the second semiconductor element of second semiconductor device 3B is connected to second terminal portion 2 via fourth wiring portion 5B. Emitter terminal 8C of the second semiconductor element of third semiconductor device 3C is connected to second terminal portion 2 via sixth wiring portion 5C.

A power conducting capability of first semiconductor device 3A is lower than a power conducting capability of second semiconductor device 3B. The power conducting capability of first semiconductor device 3A is lower than the power conducting capability of third semiconductor device 3C. The power conducting capability of each of first semiconductor device 3A, second semiconductor device 3B, and third semiconductor device 3C refers to flowability of current between the collector and emitter of each semiconductor device when the semiconductor device is placed in a specific state. That is, the power conducting capability of each semiconductor device refers to a characteristic relating to an impedance of the semiconductor device. A low power conducting capability means a high impedance. Moreover, for example, when each semiconductor device includes the first semiconductor element and the second semiconductor element connected in series, the power conducting capability of the semiconductor device may be evaluated in accordance with an average value of the power conducting capability of the first semiconductor element and the power conducting capability of the second semiconductor element of the semiconductor device, or may be evaluated in accordance with the power conducting capability of the first semiconductor element of the semiconductor device as a representative value, or may be evaluated in accordance with the power conducting capability of the second semiconductor element of the semiconductor device as a representative value. When the power conducting capability of each semiconductor device is evaluated in accordance with the representative value of the power conducting capabilities of the plurality of semiconductor elements, the power conducting capability of a semiconductor element having the same relation with first terminal portion 1 or second terminal portion 2 in terms of connection thereto is employed as the representative value.

The power conducting capability can be represented by at least one of the following parameters, for example.

In a first example, the power conducting capability is expressed as a collector-emitter saturation voltage Vce(sat). The collector-emitter saturation voltage Vce(sat) refers to a collector-emitter voltage when rated current is supplied to each semiconductor device. The collector-emitter saturation voltage of first semiconductor device 3A is higher than each of the collector-emitter saturation voltages of second semiconductor device 3B and third semiconductor device 3C.

In a second example, the power conducting capability is expressed as a gate threshold voltage Vge(th). The gate threshold voltage Vge(th) refers to gate voltage required for current 1/10000 times as large as the rated current to flow when determined voltage is applied between the collector and emitter of each semiconductor device. The gate threshold voltage of first semiconductor device 3A is higher than each of the gate threshold voltages of second semiconductor device 3B and third semiconductor device 3C.

In a third example, the power conducting capability is expressed as a conduction start delay time tdon. Conduction start delay time tdon refers to a delay time from application of determined gate voltage to each semiconductor device until current having a determined value flows between the collector and the emitter. Conduction start delay time tdon of first semiconductor device 3A is longer than each of conduction start delay times tdon of second semiconductor device 3B and third semiconductor device 3C.

From a different viewpoint, it can be said that an internal impedance of first semiconductor device 3A is higher than an internal impedance of each of second semiconductor device 3B and third semiconductor device 3C.

As shown in FIG. 1 and FIG. 7, first wiring portion 4A, third wiring portion 4B, and fifth wiring portion 4C are connected to one another in parallel. Second wiring portion 5A, fourth wiring portion 5B, and sixth wiring portion 5C are connected to one another in parallel.

As shown in FIG. 7, first wiring portion 4A connects between first terminal portion 1 and collector terminal 7A of the first semiconductor element of first semiconductor device 3A in the shortest distance. Second wiring portion 5A connects between second terminal portion 2 and emitter terminal 8A of the second semiconductor element of first semiconductor device 3A in the shortest distance.

As shown in FIG. 7, third wiring portion 4B connects between first terminal portion 1 and collector terminal 7B of the first semiconductor element of second semiconductor device 3B in the shortest distance. Fourth wiring portion 5B connects between second terminal portion 2 and emitter terminal 8B of the second semiconductor element of second semiconductor device 3B in the shortest distance.

As shown in FIG. 7, fifth wiring portion 4C connects between first terminal portion 1 and collector terminal 7C of the first semiconductor element of third semiconductor device 3C in the shortest distance. Sixth wiring portion 5C connects between second terminal portion 2 and emitter terminal 8C of the second semiconductor element of third semiconductor device 3C in the shortest distance.

As shown in FIG. 1, the total of the length of first wiring portion 4A and the length of second wiring portion 5A is designed to be less than the total of the length of third wiring portion 4B and the length of fourth wiring portion 5B. That is, the total of the distance between first terminal portion 1 and collector terminal 7A of the first semiconductor element of first semiconductor device 3A and the distance between second terminal portion 2 and emitter terminal 8A of the second semiconductor element of first semiconductor device 3A is designed to be less than the total of the distance between first terminal portion 1 and collector terminal 7B of the first semiconductor element of second semiconductor device 3B and the distance between second terminal portion 2 and emitter terminal 8B of the second semiconductor element of second semiconductor device 3B.

As shown in FIG. 1, the total of the length of first wiring portion 4A and the length of second wiring portion 5A is designed to be less than the total of the length of fifth wiring portion 4C and the length of sixth wiring portion 5C. That is, the total of the distance between first terminal portion 1 and collector terminal 7A of the first semiconductor element of first semiconductor device 3A and the distance between second terminal portion 2 and emitter terminal 8A of the second semiconductor element of first semiconductor device 3A is designed to be less than the total of the distance between first terminal portion 1 and collector terminal 7C of the first semiconductor element of third semiconductor device 3C and the distance between second terminal portion 2 and emitter terminal 8C of the second semiconductor element of third semiconductor device 3C. That is, as shown in FIG. 1, first semiconductor device 3A is disposed between second semiconductor device 3B and third semiconductor device 3C in a second direction B orthogonal to a first direction A that connects between first terminal portion 1 and second terminal portion 2 in the shortest distance. In other words, first semiconductor device 3A having the lowest power conducting capability is disposed close to first terminal portion 1 and second terminal portion 2 relative to second semiconductor device 3B and third semiconductor device 3C.

As shown in FIG. 1, collector terminal 7A, collector terminal 7B, and collector terminal 7C are disposed close to first terminal portion 1 relative to emitter terminal 8A, emitter terminal 8B, and emitter terminal 8C. Emitter terminal 8A, emitter terminal 8B, and emitter terminal 8C are disposed close to second terminal portion 2 relative to collector terminal 7A, collector terminal 7B, and collector terminal 7C. More preferably, first semiconductor device 3A, second semiconductor device 3B, and third semiconductor device 3C are disposed in parallel with one another. That is, a line segment that connects between collector terminal 7A and emitter terminal 8A is disposed in parallel with a line segment that connects between collector terminal 7B and emitter terminal 8B and a line segment that connects between collector terminal 7C and emitter terminal 8C. Each of these line segments is disposed along first direction A described above. It should be noted that for example, a surface of each of first semiconductor device 3A, second semiconductor device 3B, and third semiconductor device 3C opposite to the surface thereof shown in FIG. 1 is fixed to a housing not shown in the figure.

Figure 4:
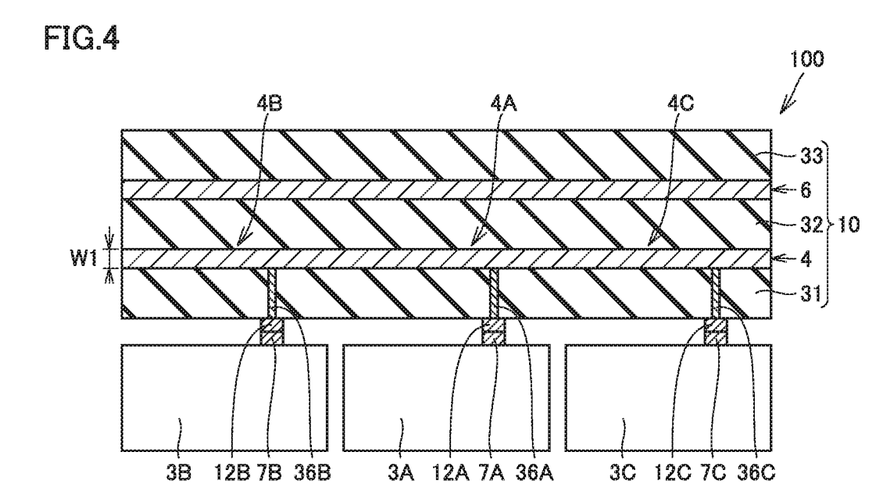
FIG. 4 is a cross sectional view when seen from a line segment IV-IV in FIG. 1.

As shown in FIG. 4, minimum thickness W1 of first wiring portion 4A is designed to be equal to the minimum thickness of third wiring portion 4B. The minimum thickness of first wiring portion 4A is designed to be equal to the minimum thickness of fifth wiring portion 4C. The minimum thickness of second wiring portion 5A is designed to be equal to the minimum thickness of fourth wiring portion 5B. The minimum thickness of second wiring portion 5A is designed to be equal to the minimum thickness of sixth wiring portion 5C.

Since first wiring portion 4A, third wiring portion 4B, and fifth wiring portion 4C, as well as second wiring portion 5A, fourth wiring portion 5B, and sixth wiring portion 5C are designed to have the lengths and thicknesses described above, the total of the impedance of first wiring portion 4A and the impedance of second wiring portion 5A is lower than the total of the impedance of third wiring portion 4B and the impedance of fourth wiring portion 5B. The total of the impedance of first wiring portion 4A and the impedance of second wiring portion 5A is lower than the total of the impedance of fifth wiring portion 4C and the impedance of sixth wiring portion 5C.

A difference between the total of the impedances of first wiring portion 4A and second wiring portion 5A and the total of the impedances of third wiring portion 4B and fourth wiring portion 5B is less than or equal to a difference between the internal impedance of first semiconductor device 3A and the internal impedance of second semiconductor device 3B. Accordingly, a difference between the impedance of first current path CP1, which corresponds to the total of the respective impedances of first wiring portion 4A, first semiconductor device 3A, and second wiring portion 5A, and the impedance of second current path CP2, which corresponds to the total of the respective impedances of third wiring portion 4B, second semiconductor device 3B, and fourth wiring portion 5B, is smaller than the difference between the internal impedances of first semiconductor device 3A and second semiconductor device 3B.

A difference between the total of the impedances of first wiring portion 4A and second wiring portion 5A and the total of the impedances of fifth wiring portion 4C and sixth wiring portion 5C is less than or equal to the difference between the internal impedance of first semiconductor device 3A and the internal impedance of third semiconductor device 3C. Accordingly, in semiconductor module 100, the difference between the impedances of first current path CP1 and third current path CP3 is smaller than the difference between the impedances of first semiconductor device 3A and third semiconductor device 3C.

As shown in FIG. 1, semiconductor module 100 further includes a third terminal portion 9 connected to a load disposed outside. Each of the output terminals of first semiconductor device 3A, second semiconductor device 3B, and third semiconductor device 3C is connected to third terminal portion 9 via a third conductor 6 described later.

First wiring portion 4A, third wiring portion 4B, and fifth wiring portion 4C, each of which may have an arbitrary configuration, are provided in one piece as shown in FIG. 1, for example. That is, first wiring portion 4A, third wiring portion 4B, and fifth wiring portion 4C are configured as portions of a first conductor 4. First conductor 4 and third conductor 6 are configured as portions of first wiring 10, for example.

Second wiring portion 5A, fourth wiring portion 5B, and sixth wiring portion 5C, each of which may have an arbitrary configuration, are provided in one piece as shown in FIG. 1, for example. Second wiring portion 5A, fourth wiring portion 5B, and sixth wiring portion 5C are configured as portions of a second conductor 5, for example. Second conductor 5 is configured as a portion of second wiring 11, for example.

Figure 3:
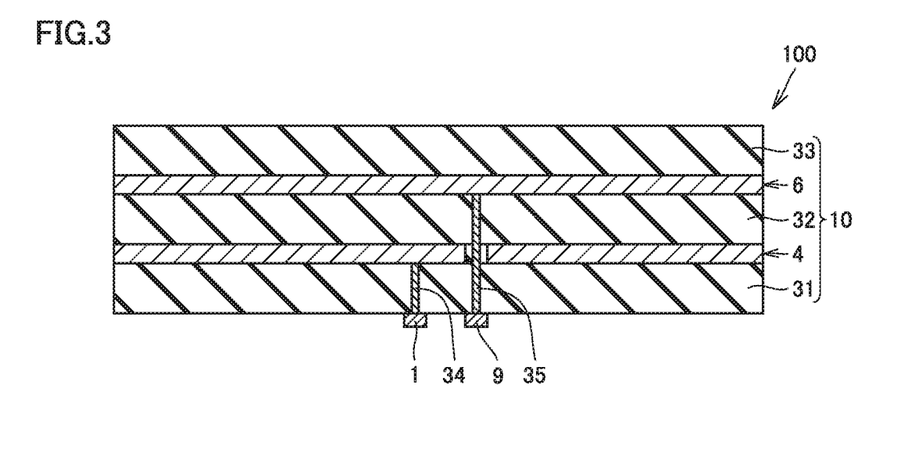
FIG. 3 is a cross sectional view when seen from a line segment III-III in FIG. 1.

As shown in FIG. 3 and FIG. 4, first wiring 10 mainly includes a first terminal portion 1, first conductor 4, third conductor 6, a third terminal portion 9, a plurality of fourth terminal portions 12A, 12B, 12D, insulation portions 31, 32, 33, and a plurality of connection portions 34, 35, 36A, 36B, 36C. Fourth terminal portions 12A, 12B, 12C are portions in contact with collector terminals 7A, 7B, 7C of the semiconductor devices, and are connected to first conductor 4 via connection portions 36A, 36B, 36C.

As shown in FIG. 3, for example, first terminal portion 1 is disposed on a surface of insulation portion 31 and is connected to first conductor 4 via connection portion 34 disposed in insulation portion 31. For example, third terminal portion 9 is disposed on the surface of insulation portion 31 and is connected to third conductor 6 via connection portion 35 disposed in insulation portion 31, first conductor 4, and insulation portion 32. Connection portion 35 is electrically insulated from first conductor 4.

As shown in FIG. 4, for example, fourth terminal portion 12A is disposed on a surface of insulation portion 31, and is connected to first wiring portion 4A of first conductor 4 via connection portion 36A disposed in insulation portion 31. For example, fourth terminal portion 12B is disposed on the surface of insulation portion 31, and is connected to third wiring portion 4B of first conductor 4 via connection portion 36B disposed in insulation portion 31. For example, fourth terminal portion 12C is disposed on the surface of insulation portion 31, and is connected to fifth wiring portion 4C of first conductor 4 via connection portion 36C disposed in insulation portion 31.

Figure 5:
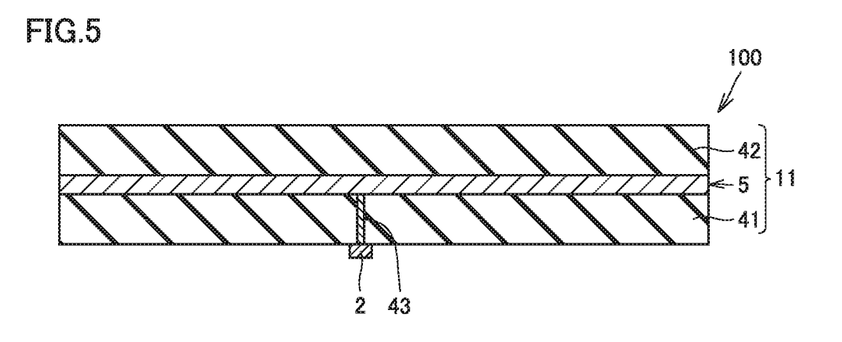
FIG. 5 is a cross sectional view when seen from a line segment V-V in FIG. 1.
Figure 6:
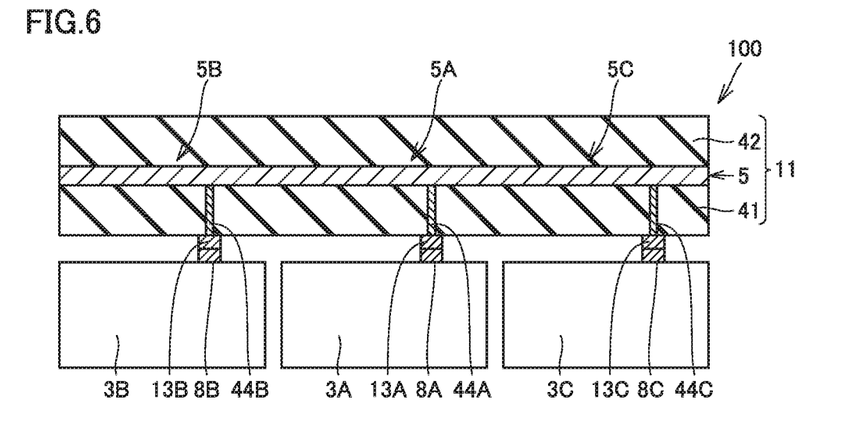
FIG. 6 is a cross sectional view when seen from a line segment VI-VI in FIG. 1.

As shown in FIG. 5 and FIG. 6, second wiring 11 mainly includes a second terminal portion 2, second conductor 5, insulation portions 41, 42, a plurality of fifth terminal portions 13A, 13B, 13C, and a plurality of connection portions 43, 44A, 44B, 44C, for example. Fifth terminal portions 13A, 13B, 13C are portions in contact with emitter terminals 8A, 8B, 8C of the semiconductor devices, and are connected to second conductor 5 via connection portions 44A, 44B, 44C.

As shown in FIG. 5, for example, second terminal portion 2 is disposed on the surface of insulation portion 41, and is connected to second conductor 5 via connection portion 43 disposed in insulation portion 41.

As shown in FIG. 6, for example, fifth terminal portion 13A is disposed on a surface of insulation portion 41, and is connected to second wiring portion 5A of second conductor 5 via connection portion 44A disposed in insulation portion 41. For example, fifth terminal portion 13B is disposed on the surface of insulation portion 41, and is connected to fourth wiring portion 5B of second conductor 5 via connection portion 44B disposed in insulation portion 41. For example, fifth terminal portion 13C is disposed on the surface of insulation portion 41, and is connected to sixth wiring portion 5C of second conductor 5 via connection portion 44C disposed in insulation portion 41.

The plurality of connection portions 36A, 36B, 36C have configurations equivalent to one another. That is, the impedances of the plurality of connection portions 36A, 36B, 36C are equal to one another. The plurality of connection portions 44A, 44B, 44C have configurations equivalent to one another. That is, the impedances of the plurality of connection portions 44A, 44B, 44C are equal to one another.

Each of first conductor 4, second conductor 5, third conductor 6, and the plurality of connection portions may be composed of any material having electrical conductivity. Examples thereof include copper (Cu) or aluminum (Al). Each of the plurality of connection portions may be configured as a fixing member for fixing semiconductor module 100 to outside, such as a screw. Each of insulation portions 31, 32, 33, 41, 42 may be composed of any material having an electrical insulation characteristic, such as a resin.

It should be noted that first wiring 10 may be configured as a laminated bus bar in which first conductor 4 and third conductor 6 are laminated by insulation portions 31, 32, 33. Second wiring 11 may be configured as a bus bar in which second conductor 5 is laminated by insulation portions 41, 42. Moreover, each of first wiring portion 4A, third wiring portion 4B, and fifth wiring portion 4C may be configured as a lead wire. Each of second wiring portion 5A, fourth wiring portion 5B, and sixth wiring portion 5C may be configured as a lead wire. Moreover, each of first wiring portion 4A, third wiring portion 4B, and fifth wiring portion 4C may be configured as a lead frame. Each of second wiring portion 5A, fourth wiring portion 5B, and sixth wiring portion 5C may be configured as a lead frame.

Figure 2:
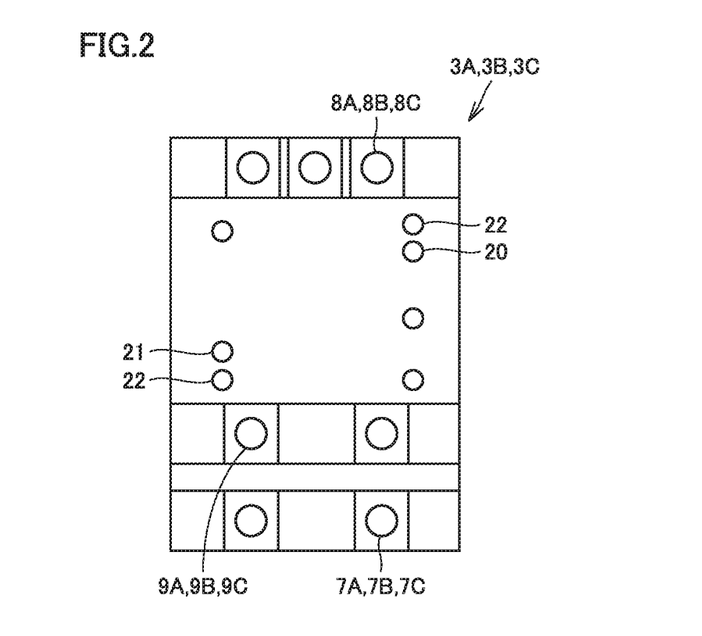
FIG. 2 is a plan view of a semiconductor device shown in FIG. 1.

As shown in FIG. 2, for example, each of first semiconductor device 3A, second semiconductor device 3B, and third semiconductor device 3C is provided with: a first gate terminal 20 connected to the gate of the first semiconductor element; a second gate terminal 22 connected to the gate of the second semiconductor element; a first emitter auxiliary terminal 21 connected to the emitter of the first semiconductor element; and a second emitter auxiliary terminal 23 connected to the emitter of the second semiconductor element.

<Method for Manufacturing Semiconductor Module>

Next, the following describes a method for manufacturing semiconductor module 100. First, first semiconductor device 3A, second semiconductor device 3B, and third semiconductor device 3C, each of which has the same specification, are prepared.

Next, the power conducting capabilities of first semiconductor device 3A, second semiconductor device 3B, and third semiconductor device 3C thus prepared are evaluated. For example, at least one of the three parameters described above is measured. An existing measuring method can be used to measure each of the parameters. Accordingly, a variation in power conducting capabilities is evaluated among first semiconductor device 3A, second semiconductor device 3B, and third semiconductor device 3C, which are designed and manufactured in accordance with the same specification. As a result, in this step, it is found that the power conducting capability of first semiconductor device 3A is lower than the power conducting capability of each of second semiconductor device 3B and third semiconductor device 3C, and it is found how low the power conducting capability of first semiconductor device 3A is. It should be noted that the power conducting capability of each of first semiconductor device 3A, second semiconductor device 3B, and third semiconductor device 3C may be measured in advance, and may be checked when manufacturing first semiconductor device 3A, second semiconductor device 3B, and third semiconductor device 3C, for example. The evaluation of the power conducting capability may be performed using one of the above-described three parameters described in a credential prepared upon manufacturing each of first semiconductor device 3A, second semiconductor device 3B, and third semiconductor device 3C, for example.

Next, based on the evaluation result in the previous step, a relative positioning relation among first semiconductor device 3A, second semiconductor device 3B, and third semiconductor device 3C in semiconductor module 100 is determined. Specifically, a positioning relation of each of first semiconductor device 3A, second semiconductor device 3B, and third semiconductor device 3C with respect to first terminal portion 1 and second terminal portion 2 is determined.

Next, first wiring 10 and second wiring 11 are prepared. First wiring 10 and second wiring 11 are prepared such that the difference between the impedances of first current path CP1 and second current path CP2 is smaller than the variation in the impedances of first semiconductor device 3A and second semiconductor device 3B, and such that the difference between the impedances of first current path CP1 and third current path CP3 is smaller than the difference between the impedances of first semiconductor device 3A and third semiconductor device 3C.

Next, based on the positioning relation determined in the previous step, first semiconductor device 3A, second semiconductor device 3B, and third semiconductor device 3C are fixed in semiconductor module 100. First semiconductor device 3A having a relatively low power conducting capability is disposed close to first terminal portion 1 and second terminal portion 2 relative to second semiconductor device 3B and third semiconductor device 3C each having a relatively high power conducting capability. Further, first wiring 10 and second wiring 11 prepared in the previous step are connected to first semiconductor device 3A, second semiconductor device 3B, and third semiconductor device 3C. Accordingly, each of first wiring portion 4A, second wiring portion 5A, third wiring portion 4B, fourth wiring portion 5B, fifth wiring portion 4C, and sixth wiring portion 5C is formed, thereby manufacturing semiconductor module 100.

<Function and Effect>

The parallel connection portion described in Patent Literature 1 is provided to connect between the semiconductor devices and the DC power supply with the wirings having the same length so as to attain an uniform impedance in the current paths between the semiconductor devices and the DC power supply. Accordingly, when a plurality of semiconductor devices having the same specification and having a variation in power conducting capabilities are connected in parallel by such a parallel connection portion, a difference between the impedances of the current paths formed in parallel becomes equal to a difference between the impedances of the plurality of semiconductor devices. Accordingly, in the power conversion device including the parallel connection portion, loads imposed on the semiconductor devices are varied due to the variation in the power conducting capabilities among the plurality of semiconductor devices, thus resulting in a variation in the lives of the semiconductor devices. As a result, it is difficult to sufficiently extend the life of such a power conversion device.

To address this, semiconductor module 100 includes: first terminal portion 1 and second terminal portion 2 each connected to outside; and first current path CP1 and second current path CP2 to connect between first terminal portion 1 and second terminal portion 2 in parallel. First current path CP1 includes: first semiconductor device 3A; first wiring portion 4A to connect between first terminal portion 1 and first semiconductor device 3A; and second wiring portion 5A to connect between first semiconductor device 3A and second terminal portion 2. Second current path CP2 includes: second semiconductor device 3B; third wiring portion 4B to connect between first terminal portion 1 and second semiconductor device 3B; and fourth wiring portion 5B to connect between second semiconductor device 3B and second terminal portion 2. The power conducting capability of first semiconductor device 3A is lower than the power conducting capability of second semiconductor device 3B, and the total of the impedance of first wiring portion 4A and the impedance of second wiring portion 5A is lower than the total of the impedance of third wiring portion 4B and the impedance of fourth wiring portion 5B.

In semiconductor module 100, first wiring portion 4A, second wiring portion 5A, third wiring portion 4B, and fourth wiring portion 5B are designed to eliminate the variation in the power conducting capabilities of first semiconductor device 3A and second semiconductor device 3B. Accordingly, the difference between the impedance of first current path CP1 and the impedance of second current path CP2 of semiconductor module 100 is suppressed to be small as compared with a case where first semiconductor device 3A and second semiconductor device 3B are connected by the above-described parallel connection portion. From a different viewpoint, it can be said that the difference between the impedance of first current path CP1 and the impedance of second current path CP2 of semiconductor module 100 is suppressed to be less than the variation in the impedances of first semiconductor device 3A and second semiconductor device 3B.

Therefore, in semiconductor module 100, a variation in value of current flowing in first current path CP1 and value of current flowing in second current path CP2 are suppressed to be smaller than a variation in values of currents flowing into respective current paths in the conventional power conversion device including the above-described parallel connection portion. As a result, the reliability of semiconductor module 100 is sufficiently improved as compared with the conventional power conversion device.

Further, semiconductor module 100 further includes third current path CP3. Third current path CP3 includes: third semiconductor device 3C; fifth wiring portion 4C to connect between first terminal portion 1 and third semiconductor device 3C; and sixth wiring portion 5C to connect between third semiconductor device 3C and second terminal portion 2. The power conducting capability of first semiconductor device 3A is lower than the power conducting capability of third semiconductor device 3C, and the total of the impedance of first wiring portion 4A and the impedance of second wiring portion 5A is lower than the total of the impedance of fifth wiring portion 4C and the impedance of sixth wiring portion 5C. Accordingly, a difference between the impedance of first current path CP1 and the impedance of third current path CP3 is suppressed to be small as compared with a case where first semiconductor device 3A, second semiconductor device 3B, and third semiconductor device 3C are connected by the above-described parallel connection portion.

In semiconductor module 100, in a plan view, first wiring portion 4A connects between first terminal portion 1 and first semiconductor device 3A in the shortest distance. In the plan view, second wiring portion 5A connects between second terminal portion 2 and first semiconductor device 3A in the shortest distance. In the plan view, third wiring portion 4B connects between first terminal portion 1 and second semiconductor device 3B in the shortest distance. In the plan view, fourth wiring portion 5B connects between second terminal portion 2 and second semiconductor device 3B in the shortest distance. The total of the shortest distance between first terminal portion 1 and first semiconductor device 3A and the shortest distance between second terminal portion 2 and first semiconductor device 3A is less than the total of the shortest distance between first terminal portion 1 and second semiconductor device 3B and the shortest distance between second terminal portion 2 and second semiconductor device 3B.

In this way, the total of the impedance of first wiring portion 4A and the impedance of second wiring portion 5A can be lower than the total of the impedance of third wiring portion 4B and the impedance of fourth wiring portion 5B.

Moreover, such a semiconductor module 100 is particularly suitable when a location in which a plurality of semiconductor devices can be disposed is limited. In such a case, differences inevitably occur among the shortest distance between first terminal portion 1 and first semiconductor device 3A, the shortest distance between first terminal portion 1 and second semiconductor device 3B, and the shortest distance between first terminal portion 1 and third semiconductor device 3C. According to semiconductor module 100, by using such differences among the shortest distances, differences can occur among the impedance of first wiring portion 4A, the impedance of third wiring portion 4B, and the impedance of fifth wiring portion 4C. Accordingly, according to semiconductor module 100, while the above-described parallel connection portion for attaining the equal wiring lengths without using the differences among the shortest distances is unnecessary, reliability is sufficiently improved as compared with the conventional power conversion device using the above-described parallel connection portion.

In semiconductor module 100, each of first semiconductor device 3A and second semiconductor device 3B is a bipolar transistor. The power conducting capability may be a collector-emitter saturation voltage, for example. When the collector-emitter saturation voltage of first semiconductor device 3A is higher than the collector-emitter saturation voltage of second semiconductor device 3B, the total of the impedance of first wiring portion 4A and the impedance of second wiring portion 5A is lower than the total of the impedance of third wiring portion 4B and the impedance of fourth wiring portion 5B.

In this way, first semiconductor device 3A which has a relatively high collector-emitter saturation voltage and in which current is less likely to flow is connected to first wiring portion 4A and second wiring portion 5A each of which has a relatively low impedance and in each of which current is more likely to flow, and second semiconductor device 3B which has a relatively low collector-emitter saturation voltage and in which current is more likely to flow is connected to third wiring portion 4B and fourth wiring portion 5B each of which has a relatively high impedance and in each of which current is less likely to flow. Therefore, according to semiconductor module 100, as compared with a case where the total of the impedance of first wiring portion 4A and the impedance of second wiring portion 5A is equal to the total of the impedance of third wiring portion 4B and the impedance of fourth wiring portion 5B, the difference between the impedance of first current path CP1 and the impedance of second current path CP2 is suppressed to be smaller than the variation in the impedance of first semiconductor device 3A and the impedance of second semiconductor device 3B. As a result, in semiconductor module 100, reliability is sufficiently improved irrespective of the variation in the power conducting capabilities of first semiconductor device 3A and second semiconductor device 3B.

Further, for example, in a semiconductor module 100 used for a main conversion circuit of a power conversion device for electric railways, the collector-emitter saturation voltage of each semiconductor element can be measured comparatively readily in many cases. As a result, semiconductor module 100 can be manufactured comparatively readily by using the collector-emitter saturation voltage as the above-described power conducting capability.

In semiconductor module 100, each of first semiconductor device 3A and second semiconductor device 3B is a gate type transistor. The above-described power conducting capability may be a gate threshold voltage, for example. When the gate threshold voltage of first semiconductor device 3A is higher than the gate threshold voltage of second semiconductor device 3B, the total of the impedance of first wiring portion 4A and the impedance of second wiring portion 5A is lower than the total of the impedance of third wiring portion 4B and the impedance of fourth wiring portion 5B.

In this way, first semiconductor device 3A which has a relatively high gate threshold voltage and in which current is less likely to flow is connected to first wiring portion 4A and second wiring portion 5A each of which has a relatively low impedance and in each of which current is more likely to flow, and second semiconductor device 3B which has a relatively low gate threshold voltage and in which current is more likely to flow is connected to third wiring portion 4B and fourth wiring portion 5B each of which has a relatively high impedance and in each of which current is less likely to flow. Therefore, according to semiconductor module 100, the difference between the impedance of first current path CP1 and the impedance of second current path CP2 is suppressed to be smaller than a variation in the impedance of first semiconductor device 3A and the impedance of second semiconductor device 3B as compared with a case where the total of the impedance of first wiring portion 4A and the impedance of second wiring portion 5A is equal to the total of the impedance of third wiring portion 4B and the impedance of fourth wiring portion 5B. As a result, in semiconductor module 100, reliability is sufficiently improved irrespective of the variation in the power conducting capabilities of first semiconductor device 3A and second semiconductor device 3B.

In semiconductor module 100, the power conducting capability may be a conduction start delay time. When the conduction start delay time of first semiconductor device 3A is longer than the conduction start delay time of second semiconductor device 3B, the total of the impedance of first wiring portion 4A and the impedance of second wiring portion 5A is lower than the total of the impedance of third wiring portion 4B and the impedance of fourth wiring portion 5B.

In this way, first semiconductor device 3A for which the conduction start delay time is relatively long and in which current is less likely to flow due to a slow switching speed is connected to first wiring portion 4A and second wiring portion 5A each of which has a relatively low impedance and in each of which current is more likely to flow, and second semiconductor device 3B for which the conduction start delay time is relatively short and in which current is more likely to flow due to a fast switching speed is connected to third wiring portion 4B and fourth wiring portion 5B each of which has a relatively high impedance and in each of which current is less likely to flow. Therefore, according to semiconductor module 100, the difference between the impedance of first current path CP1 and the impedance of second current path CP2 is suppressed to be smaller than the variation in the impedance of first semiconductor device 3A and the impedance of second semiconductor device 3B as compared with a case where the total of the impedance of first wiring portion 4A and the impedance of second wiring portion 5A is equal to the total of the impedance of third wiring portion 4B and the impedance of fourth wiring portion 5B. As a result, in semiconductor module 100, reliability is high irrespective of the variation in the power conducting capabilities of first semiconductor device 3A and second semiconductor device 3B.

Second Embodiment

Figure 8:
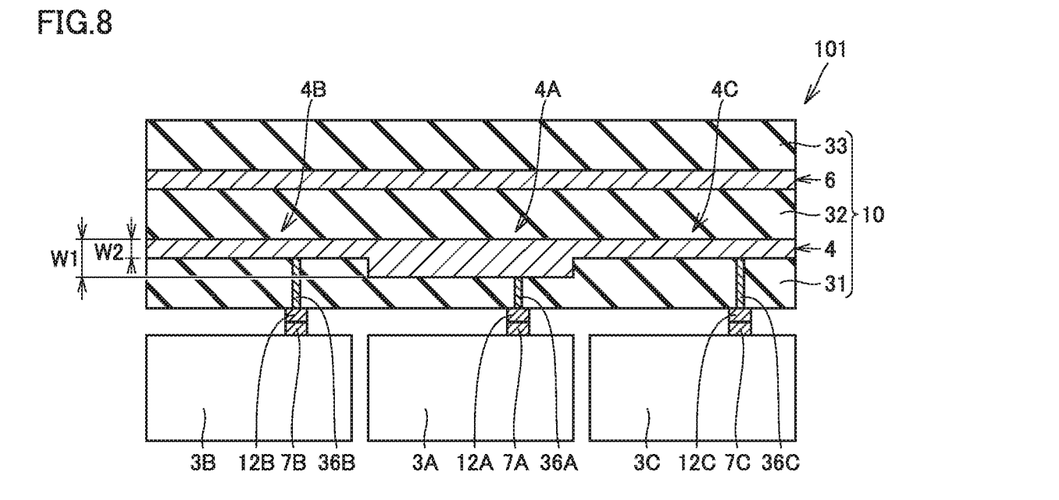
FIG. 8 is a cross sectional view of a semiconductor module according to a second embodiment.

As shown in FIG. 8, a semiconductor module 101 according to a second embodiment has basically the same configuration as that of semiconductor module 100 according to the first embodiment, but is different therefrom in that the thickness of first wiring portion 4A is different from the thickness of each of third wiring portion 4B and fifth wiring portion 4C. In semiconductor module 100, the differences between the impedances of the wiring portions are designed in accordance with the differences between the shortest distances between first terminal portion 1 or second terminal portion 2 and the respective semiconductor devices, which are connected via corresponding wiring portions. On the other hand, in semiconductor module 101, the differences between the impedances of the wiring portions are designed in accordance with the differences between the shortest distances between first terminal portion 1 or second terminal portion 2 and the respective semiconductor devices, which are connected via corresponding wiring portions, as well as differences between the thicknesses of the wiring portions.

As shown in FIG. 8, minimum thickness W1 of first wiring portion 4A is provided to be thicker than minimum thickness W2 of third wiring portion 4B and the minimum thickness of fifth wiring portion 4C, for example. Minimum thickness W2 of third wiring portion 4B is equal to the minimum thickness of fifth wiring portion 4C, for example. Moreover, minimum thickness W1 of first wiring portion 4A may be provided to be thinner than minimum thickness W2 of third wiring portion 4B and the minimum thickness of fifth wiring portion 4C, for example.

According to such a semiconductor module 101, the impedances of first wiring portion 4A, third wiring portion 4B, and fifth wiring portion 4C are controlled in accordance with the shortest distances and the minimum thicknesses of first wiring portion 4A, third wiring portion 4B, and fifth wiring portion 4C. Therefore, the impedance of each of first wiring portion 4A, third wiring portion 4B, and fifth wiring portion 4C in semiconductor module 101 can be controlled in a more detailed manner than each of those of semiconductor module 100. As a result, in semiconductor module 101, the impedance of first current path CP1 can be equal to the impedance of each of second current path CP2 and third current path CP3.

Moreover, when minimum thickness W1 of first wiring portion 4A is provided to be thicker than minimum thickness W2 of third wiring portion 4B and the minimum thickness of fifth wiring portion 4C, a difference between the impedance of first wiring portion 4A and the impedance of third wiring portion 4B can be designed to be larger, by a difference between the minimum thicknesses thereof, than a difference between the impedance of first wiring portion 4A and the impedance of third wiring portion 4B in semiconductor module 100.

Hence, semiconductor module 101 is suitable when a variation in the impedances of first semiconductor device 3A and second semiconductor device 3B is larger than the difference between the impedance of first wiring portion 4A and the impedance of third wiring portion 4B in semiconductor module 100. That is, semiconductor module 101 is suitable when it is considered that the variation in the impedances of first semiconductor device 3A and second semiconductor device 3B is still large in view of improvement in reliability of the semiconductor module even though the variation is reduced by the difference between the shortest distance between first terminal portion 1 and collector terminal 7A of first semiconductor device 3A and the shortest distance between first terminal portion 1 and collector terminal 7B of second semiconductor device 3B. Also in such a case, according to semiconductor module 101, first wiring portion 4A, second wiring portion 5A, third wiring portion 4B, and fourth wiring portion 5B are designed to sufficiently eliminate the variation in the impedances of first semiconductor device 3A and second semiconductor device 3B. Hence, the difference between the impedance of first current path CP1 and the impedance of second current path CP2 can be suppressed to be sufficiently small. As a result, reliability of semiconductor module 101 is sufficiently improved even when the variation in the impedances of first semiconductor device 3A and second semiconductor device 3B is comparatively large.

Moreover, when the minimum thickness of first wiring portion 4A is provided to be thicker than each of the minimum thicknesses of third wiring portion 4B and fifth wiring portion 4C, a difference between the impedance of first wiring portion 4A and the impedance of third wiring portion 4B can be designed to be smaller, by a difference between the minimum thicknesses thereof, than a difference between the impedance of first wiring portion 4A and the impedance of third wiring portion 4B in semiconductor module 100.

Such a semiconductor module 101 is suitable when the variation in the impedances of first semiconductor device 3A and second semiconductor device 3B is smaller than the difference between the impedance of first wiring portion 4A and the impedance of third wiring portion 4B in semiconductor module 100. That is, semiconductor module 101 is suitable when the variation in the impedances of first semiconductor device 3A and second semiconductor device 3B is smaller than the difference in impedances realized by the difference between the shortest distance between first terminal portion 1 and collector terminal 7A of first semiconductor device 3A and the shortest distance between first terminal portion 1 and collector terminal 7B of second semiconductor device 3B when first semiconductor device 3A and second semiconductor device 3B are disposed at determined locations. Also in such a case, according to semiconductor module 101, first wiring portion 4A, second wiring portion 5A, third wiring portion 4B, and fourth wiring portion 5B are designed to sufficiently eliminate the variation in the impedances of first semiconductor device 3A and second semiconductor device 3B. Hence, the difference between the impedance of first current path CP1 and the impedance of second current path CP2 can be suppressed to be sufficiently small.

It should be noted that the minimum thickness of second wiring portion 5A may be provided to be thicker or thinner than each of the minimum thicknesses of fourth wiring portion 5B and sixth wiring portion 5C. Moreover, minimum thickness W1 of first wiring portion 4A may be provided to be thicker or thinner than minimum thickness W2 of third wiring portion 4B and the minimum thickness of fifth wiring portion 4C, and the minimum thickness of second wiring portion 5A may be provided to be thicker or thinner than each of the minimum thicknesses of fourth wiring portion 5B and sixth wiring portion 5C.

<Modification>

In each of semiconductor modules 100, 101, each of first wiring portion 4A, third wiring portion 4B, and fifth wiring portion 4C connects between first terminal portion 1 and a corresponding one of the collector terminals of first semiconductor device 3A, second semiconductor device 3B, and third semiconductor device 3C in the shortest distance, but the configuration is not limited to this. Likewise, each of second wiring portion 5A, fourth wiring portion 5B, and sixth wiring portion 5C connects between second terminal portion 2 and a corresponding one of the collector terminals of first semiconductor device 3A, second semiconductor device 3B, and third semiconductor device 3C in the shortest distance, but the configuration is not limited to this.

The wiring length of each wiring portion can be designed appropriately as long as at least one of the differences between the impedances of first wiring portion 4A, third wiring portion 4B, and fifth wiring portion 4C, and the differences between the impedances of second wiring portion 5A, fourth wiring portion 5B, and sixth wiring portion 5C is designed to reduce the variation in the power conducting capabilities of first semiconductor device 3A, second semiconductor device 3B, and third semiconductor device 3C.

Third Embodiment

Figure 9:
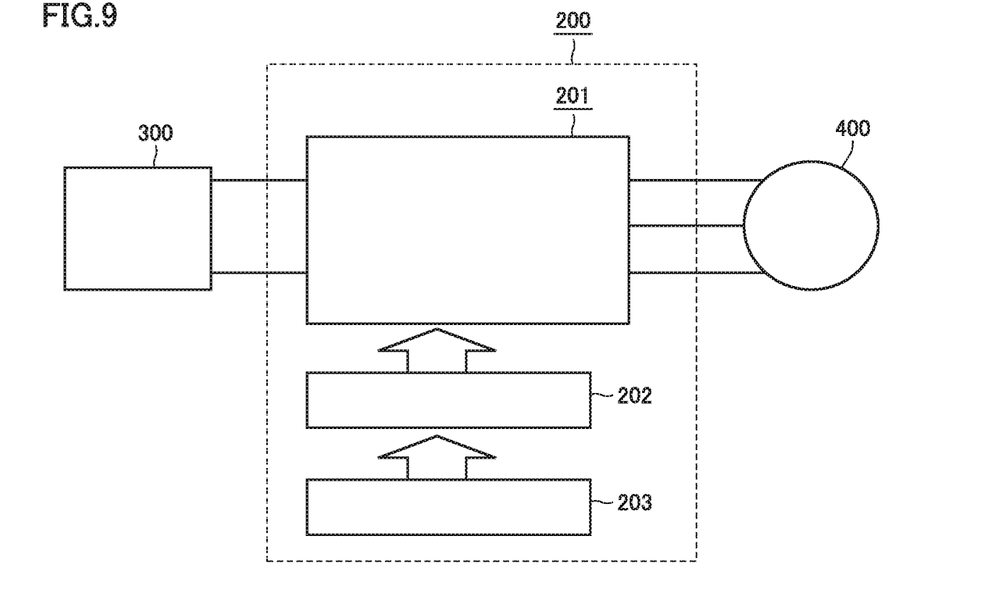
FIG. 9 is a block diagram showing a power conversion device according to a third embodiment.

The present embodiment is obtained by applying semiconductor module 100 or 101 according to the above-described first or second embodiment to a power conversion device. Although the present embodiment is not limited to a specific power conversion device, the following describes a case where the present invention is applied to a three-phase inverter as a third embodiment. FIG. 9 is a block diagram showing a configuration of a power conversion system to which a power conversion device 200 according to the third embodiment is applied.

The power conversion system shown in FIG. 9 includes power conversion device 200, a power supply 300, and a load 400. Power conversion device 200 is a three-phase inverter connected between power supply 300 and load 400, and converts DC power supplied from power supply 300 into AC power and supplies the AC power to load 400. As shown in FIG. 9, power conversion device 200 includes: a main conversion circuit 201 to convert DC power into AC power and output the AC power; and a control circuit 203 to output, to main conversion circuit 201, a control signal for controlling main conversion circuit 201.

Power supply 300 is a DC power supply, and supplies DC power to power conversion device 200. Power supply 300 can be constituted of various components such as a DC system, a solar cell, and a power storage battery, or can be constituted of a rectification circuit or AC/DC converter connected to an AC system. Moreover, power supply 300 may be constituted of a DC/DC converter to convert, into predetermined power, DC power output from a DC system.

Load 400 is a three-phase motor driven by AC power supplied from power conversion device 200. It should be noted that load 400 is not limited to one for a specific purpose of use, is a motor mounted in each of various types of electric devices, and is used as a motor for hybrid vehicles, electric vehicles, railroad vehicles, elevators, or air conditioners, for example.

Hereinafter, details of power conversion device 200 will be described. Main conversion circuit 201 includes a switching element and a reflux diode (not shown). By switching of the switching element, DC power supplied from power supply 300 is converted into AC power and is supplied to load 400. Although there are various types of specific circuit configurations for main conversion circuit 201, main conversion circuit 201 according to the present embodiment is a two-level three-phase full bridge circuit, and can be constituted of six switching elements and six reflux diodes respectively connected to the switching elements in antiparallel. Every two of the six switching elements are connected in series to form an upper-lower arm. The upper-lower arms constitute respective phases (U phase, V phase, and W phase) of the full bridge circuit. Output terminals of the upper-lower arms, i.e., three output terminals of main conversion circuit 201, are connected to load 400. In this case, the two switching elements connected in series in main conversion circuit 201 are configured as the first semiconductor element and the second semiconductor element in semiconductor module 100 or 101 of the above-described first or second embodiment. That is, in this case, main conversion circuit 201 is constituted of one semiconductor module 100.

A drive circuit 202 generates a driving signal for driving a switching element of main conversion circuit 201, and supplies it to a control electrode of the switching element of main conversion circuit 201. Specifically, in accordance with a control signal from control circuit 203 described later, drive circuit 202 outputs, to a control electrode of a switching element, a driving signal for bringing the switching element into an ON state and a driving signal for bringing the switching element into an OFF state. When the switching element is maintained to be in the ON state, the driving signal is a voltage signal (ON signal) that is more than or equal to the threshold voltage of the switching element. On the other hand, when the switching element is maintained to be in the OFF state, the driving signal is a voltage signal (OFF signal) that is less than or equal to the threshold voltage of the switching element.

Control circuit 203 controls a switching element of main conversion circuit 201 to supply desired power to load 400. Specifically, based on power to be supplied to load 400, a time (ON time) at which each switching element of main conversion circuit 201 is to be brought into the ON state is calculated. For example, main conversion circuit 201 can be controlled through PWM control to modulate the ON time of the switching element in accordance with a voltage to be output. Control circuit 203 outputs a control command (control signal) to a drive circuit included in main conversion circuit 201 so as to output an ON signal to a switching element to be brought into the ON state and an OFF signal to a switching element to be brought into the OFF state at respective points of time. In accordance with each of the control signals, the drive circuit outputs the ON signal or the OFF signal to the control electrode of a corresponding switching element as the driving signal.

Since semiconductor module 100 or 101 according to the first or second embodiment is applied to main conversion circuit 201 in power conversion device 200 according to the third embodiment, reliability is improved as compared with a conventional power conversion device.

In the present embodiment, it has been illustrated that the present invention is applied to the two-level three-phase inverter, the present invention is not limited to this, and is applicable to various types of power conversion devices. Although the two-level power conversion device is employed in the present embodiment, a three-level or multi-level power conversion device may be employed, or the present invention may be applied to a single-phase inverter when power is supplied to a single-phase load. Moreover, when power is supplied to a DC load or the like, the present invention can be applied to a DC/DC converter or an AC/DC converter.

Moreover, the power conversion device to which the present invention is applied is not limited to the case where the load is a motor, can be used as a power supply device for an electrical discharge machining apparatus, a laser machining apparatus, an induction heating cooking device, or an non-contact power feeding system, and can be also used as a power conditioner in a photovoltaic power system, a power storage system, or the like, for example.

Fourth Embodiment

Figure 10:
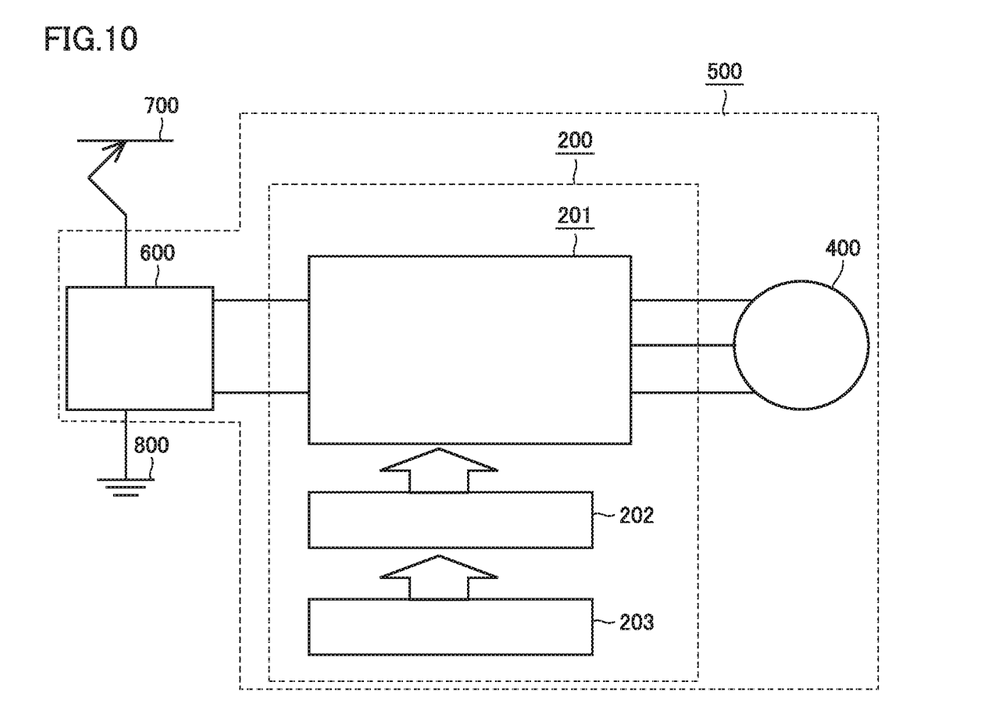
FIG. 10 is a block diagram showing a movable body according to a fourth embodiment.

The present embodiment is obtained by applying power conversion device 200 according to the third embodiment to a movable body. FIG. 10 is a block diagram showing a movable body 500 configured as an electric railroad vehicle as an exemplary movable body according to the fourth embodiment.

Movable body 500 shown in FIG. 10 includes a power conversion device 200, a load 400, and a transformer 600. Load 400 is connected to a plurality of wheels (not shown) of movable body 500.

Power conversion device 200 is connected, via transformer 600, between an overhead wire 700 and a grounding portion 800 such as a rail or a vehicle body. Power conversion device 200 converts DC power supplied from overhead wire 700 into AC power, and supplies it to load 400, for example. On this occasion, transformer 600 serves as a chopper circuit, adjusts a voltage level as required, and supplies it to power conversion device 200. Load 400 supplied with the AC power from power conversion device 200 drives to rotate the plurality of wheels.

Since semiconductor module 100 or 101 according to the first or second embodiment is applied to main conversion circuit 201 in movable body 500 according to the fourth embodiment, reliability is improved as compared with a movable body including a conventional power conversion device.

It should be noted that overhead wire 700 may be provided to supply AC power. In this case, movable body 500 may further include a converter module to convert AC power into DC power, and the DC power converted by the converter module may be supplied to power conversion device 200.

Moreover, the movable body according to the fourth embodiment is not limited to the electric railroad vehicle, and may be configured as a hybrid vehicle, an electric vehicle, and an elevator as described above.

Although the embodiments of the present invention have been illustrated, the embodiments described above can be modified in various manners. Further, the scope of the present invention is not limited to the above-described embodiments. The scope of the present invention is defined by the terms of the claims, and is intended to include any modifications within the scope and meaning equivalent to the terms of the claims.

REFERENCE SIGNS LIST

1: first terminal portion; 2: second terminal portion; 3A: first semiconductor device; 3B: second semiconductor device; 3C: third semiconductor device; 4: first conductor; 4A: first wiring portion; 4B: third wiring portion; 4C: fifth wiring portion; 5: second conductor; 5A: second wiring portion; 5B: fourth wiring portion; 5C: sixth wiring portion; 6: third conductor; 7A, 7B, 7C: collector terminal; 8A, 8B, 8C: emitter terminal; 9: third terminal portion; 9A, 9B, 9C: output terminal; 10: first wiring; 11: second wiring; 20: first gate terminal; 21: second gate terminal; 22: first emitter auxiliary terminal; 23: second emitter auxiliary terminal; 31, 32, 33, 41, 42: insulation portion; 34, 35, 36A, 36B, 36C, 37A, 37B, 37C, 43, 44A, 44B, 44C: connection portion; 100, 101: semiconductor module; 200: power conversion device; 201: main conversion circuit; 202: drive circuit; 203: control circuit; 300: power supply; 400: load; 500: movable body; 600: transformer; 700: overhead wire; 800: grounding portion; CP1: first current path; CP2: second current path; CP3: third current path.

The invention claimed is:

1. A semiconductor module comprising:
a first terminal portion and a second terminal portion each connected to outside; and
a first current path and a second current path to connect between the first terminal portion and the second terminal portion in parallel, wherein
the first current path includes a first semiconductor device, a first wiring portion to connect between the first terminal portion and the first semiconductor device, and a second wiring portion to connect between the first semiconductor device and the second terminal portion,
the second current path includes a second semiconductor device, a third wiring portion to connect between the first terminal portion and the second semiconductor device, and a fourth wiring portion to connect between the second semiconductor device and the second terminal portion, and
a power conducting capability of the first semiconductor device is lower than a power conducting capability of the second semiconductor device, and a total of an impedance of the first wiring portion and an impedance of the second wiring portion is lower than a total of an impedance of the third wiring portion and an impedance of the fourth wiring portion.

2. The semiconductor module according to claim 1, wherein
in a plan view,
the first wiring portion connects between the first terminal portion and the first semiconductor device in a shortest distance,
the second wiring portion connects between the second terminal portion and the first semiconductor device in a shortest distance,
the third wiring portion connects between the first terminal portion and the second semiconductor device in a shortest distance, and
the fourth wiring portion connects between the second terminal portion and the second semiconductor device in a shortest distance, and
a total of the shortest distance between the first terminal portion and the first semiconductor device and the shortest distance between the second terminal portion and the first semiconductor device is less than a total of the shortest distance between the first terminal portion and the second semiconductor device and the shortest distance between the second terminal portion and the second semiconductor device.

3. The semiconductor module according to claim 2, wherein a minimum thickness of each of the first wiring portion and the second wiring portion is thicker than a minimum thickness of each of the third wiring portion and the fourth wiring portion.

4. The semiconductor module according to claim 2, wherein
each of the first semiconductor device and the second semiconductor device is a bipolar transistor,
the first wiring portion is connected to a collector of the first semiconductor device and the second wiring portion is connected to an emitter of the first semiconductor device,
the third wiring portion is connected to a collector of the second semiconductor device and the fourth wiring portion is connected to an emitter of the second semiconductor device, and
a collector-emitter saturation voltage of the first semiconductor device is higher than a collector-emitter saturation voltage of the second semiconductor device.

5. The semiconductor module according to claim 2, wherein
each of the first semiconductor device and the second semiconductor device is a gate type transistor, and
a gate threshold voltage of the first semiconductor device is higher than a gate threshold voltage of the second semiconductor device.

6. The semiconductor module according to claim 2, wherein a conduction start delay time of the first semiconductor device is longer than a conduction start delay time of the second semiconductor device.

7. The semiconductor module according to claim 2, wherein an impedance of the first current path is equal to an impedance of the second current path.

8. The semiconductor module according to claim 2, wherein a material of each of the first semiconductor device and the second semiconductor device includes a wide band gap semiconductor material.

9. The semiconductor module according to claim 8, wherein the material of each of the first semiconductor device and the second semiconductor device includes silicon carbide.

10. The semiconductor module according to claim 1, wherein a minimum thickness of each of the first wiring portion and the second wiring portion is thicker than a minimum thickness of each of the third wiring portion and the fourth wiring portion.

11. The semiconductor module according to claim 10, wherein
each of the first semiconductor device and the second semiconductor device is a bipolar transistor, the first wiring portion is connected to a collector of the first semiconductor device and the second wiring portion is connected to an emitter of the first semiconductor device, the third wiring portion is connected to a collector of the second semiconductor device and the fourth wiring portion is connected to an emitter of the second semiconductor device, and a collector-emitter saturation voltage of the first semiconductor device is higher than a collector-emitter saturation voltage of the second semiconductor device.

12. The semiconductor module according to claim 10, wherein each of the first semiconductor device and the second semiconductor device is a gate type transistor, and a gate threshold voltage of the first semiconductor device is higher than a gate threshold voltage of the second semiconductor device.

13. The semiconductor module according to claim 1, wherein each of the first semiconductor device and the second semiconductor device is a bipolar transistor, the first wiring portion is connected to a collector of the first semiconductor device and the second wiring portion is connected to an emitter of the first semiconductor device, the third wiring portion is connected to a collector of the second semiconductor device and the fourth wiring portion is connected to an emitter of the second semiconductor device, and a collector-emitter saturation voltage of the first semiconductor device is higher than a collector-emitter saturation voltage of the second semiconductor device.

14. The semiconductor module according to claim 1, wherein each of the first semiconductor device and the second semiconductor device is a gate type transistor, and a gate threshold voltage of the first semiconductor device is higher than a gate threshold voltage of the second semiconductor device.

15. The semiconductor module according to claim 1, wherein a conduction start delay time of the first semiconductor device is longer than a conduction start delay time of the second semiconductor device.

16. The semiconductor module according to claim 1, wherein an impedance of the first current path is equal to an impedance of the second current path.

17. The semiconductor module according to claim 1, wherein a material of each of the first semiconductor device and the second semiconductor device includes a wide band gap semiconductor material.

18. The semiconductor module according to claim 17, wherein the material of each of the first semiconductor device and the second semiconductor device includes silicon carbide.

19. A power conversion device comprising:

a main conversion circuit to convert received power and output the converted power, the main conversion circuit having the semiconductor module recited in claim 1; and a control circuit to output, to the main conversion circuit, a control signal for controlling the main conversion circuit.

20. A movable body comprising:

the power conversion device recited in claim 19; and a motor driven by the power conversion device.

* * * * *